(12) United States Patent
Flitsch (10) Patent No.: US 8,229,585 B2
(45) Date of Patent: Jul. 24, 2012

(54) METHODS AND APPARATUS FOR VERTICALLY ORIENTING SUBSTRATE PROCESSING TOOLS IN A CLEAN SPACE

(76) Inventor: Frederick A. Flitsch, New Windsor, NY (US)

( * ) Notice: Subject to any disclaimer, the term of this patent is extended or adjusted under 35 U.S.C. 154(b) by 291 days.

(21) Appl. No.: 11/520,975

(22) Filed: Sep. 14, 2006

(65) Prior Publication Data
US 2007/0269296 A1 Nov. 22, 2007

Related U.S. Application Data

(60) Provisional application No. 60/596,343, filed on Sep. 18, 2005.

(51) Int. Cl.
*G06F 19/00* (2011.01)
(52) U.S. Cl. ................... 700/112; 700/121; 700/213
(58) Field of Classification Search .............. 700/112, 700/213, 121; 414/222.01
See application file for complete search history.

(56) References Cited

U.S. PATENT DOCUMENTS

| | | | |
|---|---|---|---|
| 3,158,457 A | 11/1964 | Whitefield | |
| 3,588,176 A | 6/1971 | Byrne et al. | |
| 3,603,646 A | 9/1971 | Leoff | |
| 3,812,947 A | 5/1974 | Nygaard | |
| 3,930,684 A | 1/1976 | Lasch, Jr. et al. | |
| 3,976,330 A | 8/1976 | Babinski et al. | |
| 4,081,201 A | 3/1978 | Hassan et al. | |
| 4,165,132 A | 8/1979 | Hassan et al. | |
| 4,278,366 A | 7/1981 | Loveless et al. | |
| 4,299,518 A | 11/1981 | Whelan | |
| 4,315,705 A | 2/1982 | Flint | |
| 4,348,139 A | 9/1982 | Hassan et al. | |
| 4,409,889 A | 10/1983 | Burleson | |
| 4,501,527 A | 2/1985 | Jacoby et al. | |
| 4,554,766 A | 11/1985 | Ziemer et al. | |
| 4,649,830 A | 3/1987 | Tanaka | |
| 4,667,579 A | 5/1987 | Daw | |
| 4,667,580 A | 5/1987 | Wetzel | |
| 2,682,927 A | 7/1987 | Southworth et al. | |
| 4,694,736 A | 9/1987 | Yamagata et al. | |
| 4,695,215 A | 9/1987 | Jacoby et al. | |
| 4,722,659 A | 2/1988 | Hoyt, III et al. | |
| 4,804,392 A | 2/1989 | Spengler | |
| 4,826,360 A | 5/1989 | Iwasawa et al. | |
| 4,840,530 A | 6/1989 | Nguyen | |
| 4,851,018 A | 7/1989 | Lazzari et al. | |
| 4,861,222 A | 8/1989 | Mirkovich | |
| 4,867,629 A | 9/1989 | Iwasawa et al. | |
| 4,875,825 A | 10/1989 | Tullis et al. | |
| 4,923,352 A | 5/1990 | Tamura et al. | |
| 4,963,069 A | 10/1990 | Wurst et al. | |
| 4,964,776 A | 10/1990 | Wakita et al. | |
| 5,029,518 A | 7/1991 | Austin | |
| 5,058,491 A | 10/1991 | Wiemer et al. | |
| 5,096,477 A | 3/1992 | Shinoda et al. | |
| 5,108,513 A | 4/1992 | Muller et al. | |
| 5,145,303 A | 9/1992 | Clarke | |
| 5,167,575 A | 12/1992 | MacDonald | |
| 5,344,365 A | 9/1994 | Scott et al. | |
| 5,518,451 A | 5/1996 | Renz et al. | |
| 5,779,799 A * | 7/1998 | Davis ........................... | 118/663 |
| 5,795,356 A | 8/1998 | Leveen | |
| 5,860,258 A | 1/1999 | Faith et al. | |

(Continued)

*Primary Examiner* — Albert Decady
*Assistant Examiner* — Steven Garland (57) ABSTRACT

A computerized system for a fabrication facility capable of routine placement and replacement of processing tools in at least a vertical dimension relative to each other.

3 Claims, 11 Drawing Sheets

U.S. PATENT DOCUMENTS

| | | |
|---|---|---|
| 6,099,599 A | 8/2000 | Wu |
| 6,183,358 B1 | 2/2001 | Adair, Jr. |
| 6,306,189 B1 | 10/2001 | Renz |
| 6,322,597 B1 | 11/2001 | Ohta |
| 6,328,768 B1 | 12/2001 | Ohta |
| 6,574,937 B1 | 6/2003 | Rapisarda |
| 6,582,178 B2 | 6/2003 | Petruccelli |
| 6,598,279 B1 | 7/2003 | Morgan |
| 6,612,084 B2 | 9/2003 | Rapisarda |
| 6,854,583 B1 | 2/2005 | Horn |
| 6,869,457 B2 | 3/2005 | Nakagawa |
| 6,902,762 B2 * | 6/2005 | Miyata .......................... 427/240 |
| 6,955,595 B2 | 10/2005 | Kim |
| 7,039,999 B2 | 5/2006 | Tarr et al. |
| 7,083,515 B2 | 8/2006 | Rapisarda et al. |
| 7,257,458 B1 | 8/2007 | Markle |
| 7,269,925 B2 | 9/2007 | Lam |
| 2002/0088543 A1 * | 7/2002 | Ashjaee et al. .......... 156/345.31 |
| 2004/0006544 A1 * | 1/2004 | Gulett ........................... 705/400 |
| 2004/0094087 A1 * | 5/2004 | Ivanov et al. ................. 118/300 |

* cited by examiner

(12) United States Patent
US 8,229,585 B2

METHODS AND APPARATUS FOR VERTICALLY ORIENTING SUBSTRATE PROCESSING TOOLS IN A CLEAN SPACE

CROSS REFERENCE TO RELATED APPLICATIONS

This application claims priority to the Provisional Application Ser. No. 60/596,343, filed Sep. 18, 2005 and entitled: Specialized Methods for Substrate Processing for a Clean Space Where Processing Tools are Vertically Oriented. The contents of each are relied upon and incorporated by reference herein.

FIELD OF THE INVENTION

The present invention relates to apparatus and methods which support fabricators with routinely replaceable processing tools vertically arranged in one or more cleanspaces.

BACKGROUND OF THE INVENTION

A known approach to cleanspace-assisted fabrication of materials such as semi-conductor substrates is to assemble a manufacturing facility as a "cleanroom." In such cleanrooms, processing tools are arranged to provide aisle space for human operators or automation equipment. Exemplary cleanroom design is described in: "Cleanroom Design, Second Edition," edited by W. Whyte, published by John Wiley & Sons, 1999, ISBN 0-471-94204-9, (herein after referred to as "the Whyte text").

Cleanroom design has evolved over time to include locating processing stations within clean hoods. Vertical unidirectional air flow can be directed through a raised floor, with separate cores for the tools and aisles. It is also known to have specialized mini-environments which surround only a processing tool for added space cleanliness. Another known approach includes the "ballroom" approach, wherein tools, operators and automation all reside in the same cleanroom.

Evolutionary improvements have enabled higher yields and the production of devices with smaller geometries. However, known cleanroom design has disadvantages and limitations.

For example, as the size of tools has increased and the dimensions of cleanrooms have increased, the volume of cleanspace that is controlled has concomitantly increased. In addition, the size of currently known fabricator processing tools and their floor space mounting surfaces and utility connections result in fabs with ever increasing floor space footprints. Consequently, the cost of building the cleanspace, and the cost of maintaining the cleanliness of such cleanspace, has increased considerably.

Tool installation in a cleanroom can be difficult. The initial "fit up" of a "fab" with tools, when the floor space is relatively empty, can be relatively straight forward. However, as tools are put in place and a fab begins to process substrates, it can become increasingly difficult and disruptive of job flow, to either place new tools or remove old ones. In some embodiments, it is desirable therefore to reduce installation difficulties attendant to dense tool placement while still maintaining such density, since denser tool placement otherwise affords substantial economic advantages relating to cleanroom construction and maintenance.

The size of substrate has increased over time as have the typical sizes of fabs. The increased size allows for economies of scale in production, but also creates economic barriers to development and new entries into the industry. A similar factor is that the processing of substrates is coordinated and controlled by batching up a number of substrates into a single processing lot. A single lot can include, for example, 25 substrates. Accordingly, known carriers are sized to typically accommodate the largest size lot that is processed in a fab.

It would be desirable to have manufacturing facilities for cleanspace-assisted fabrication, that use less cleanspace area, permit dense tool placement while maintaining ease of installation, which permit the use of more simple robotics and which are capable of efficiently processing a single substrate.

SUMMARY OF THE INVENTION

Accordingly, the present invention provides a novel design for processing fabs which arrange a clean room to allow processing tools to reside in both vertical and horizontal dimensions relative to each other and in some embodiments with their tool bodies outside of, or on the periphery of, a clean space of the fabricator. In such a design, the tool bodies can be removed and replaced with much greater ease than is the standard case. The design also anticipates the automated transfer of substrates inside a clean space from a tool port of one tool to another. The substrates can reside inside specialized carriers designed to carry ones substrate at a time. Further design enhancements can entail the use of automated equipment to carry and support the tool body movement into and out of the fab environment. In this invention, numerous methods of using some or all of these innovations in designing, operating or otherwise interacting with such fabricator environments are described. The present invention can therefore include methods and apparatus for situating processing tools in a vertical dimension and control software modules for making such tools functional.

BRIEF DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION OF PREFERRED EMBODIMENTS

The present invention relates to methods and apparatus which enable the positioning of processing tools in a fab in both vertical and horizontal dimensions. According to the present invention, a portion of a tool used to process a material is accessible from within a cleanspace in which the material is processed and an additional portion of the processing tool remains outside of the cleanspace environment in which the material is processed. In addition, the present invention provides for methods and apparatus to facilitate installation, removal and maintenance of the tools used to process the material.

Reference will now be made in detail to different aspects of some preferred embodiments of the invention, examples of which are illustrated in the accompanying drawings. Wherever possible, the same reference numbers will be used throughout the drawings to refer to the same or like parts. A Glossary of Selected Terms is included at the end of this Detailed Description.

During processing of semiconductor substrates, the substrates (sometimes referred to as "wafers") can be present in a manufacturing fabricator for many hours. In some embodiments, wafers are contained within a carrier and a self contained environment during the entire period that the substrates are not inside a processing tool. A tool port can receive such carriers and open them to position the substrates for further processing by the processing tools.

According to the present invention, tools are placed in a vertical dimension and a clean space is arranged such that one or more tool bodies reside on the periphery of the fabricator space. This allows the tools to be placed and removed in a much more straightforward approach when compared to typical clean room designs.

Traditionally, when installing a processing tool into a semiconductor fabricator, riggers had to place the tool in a designated position where the tool remained in place for its entire time in the fab. The present invention provides for an alternative strategy wherein processing tools can be routinely placed and removed from a fab location.

One aspect of the present invention therefore provides for support fixtures which facilitate efficient placement, removal and replacement of a processing tool in a predefined location defined in a matrix of vertical and horizontal dimensions. Predefined tool placement in turn facilitates predefined locations for utility interconnections and predefined locations for material transfer into and out of associated tool ports. In some embodiments, a support fixture can further provide a chassis capable of receiving a processing tool and moving a processing tool from a position external to a cleanspace to a operational location wherein at least an associated processing tool port is located inside the cleanspace environment. In some respects, movement of the tool from an installation position to an operational position can be envisioned much like a cabinet drawer moving from an outward position to a closed position.

Other aspects of some embodiments of the present invention include the connection of support items for proper operation of the processing tool. For example, electrical supplies, chemicals, gases, compressed air or other processing tool support can be passed through the tool chassis support system via flexible connections. Furthermore, wired or wireless transfer of data can be supported by the chassis body. In addition, in some embodiments, a support chassis according to the present invention can include communication interfaces with safety systems to provide safe operation and safe removal and replacement.

Figure 1:
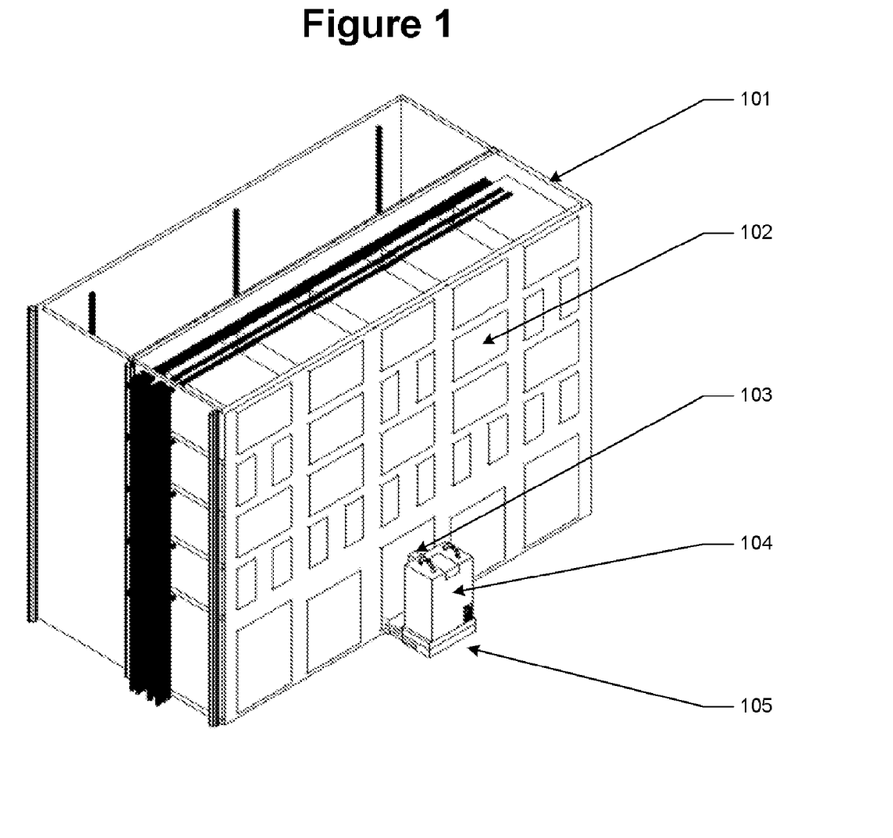
FIG. 1 illustrates an embodiment of a vertical fab showing a reversibly removable tool body.

Referring now to FIG. 1 a fabricator 101 is illustrated form a tool access side, with exemplary tools 102 presented to the fabricator environment. As illustrated, an array of various tools 102 can include some tools 102 situated above others in the vertical dimension. A tool port 103 is capable of receiving a substrate carrier (not shown) into the processing tool 102. A tool body 104 in a position for placement or replacement is also illustrated. This tool body can be situated on a tool chassis 105 for locating the tool body into a correct position. In a correct position, the tool body is situated to perform a process on the substrate introduced to the processing tool 102.

Figure 2:
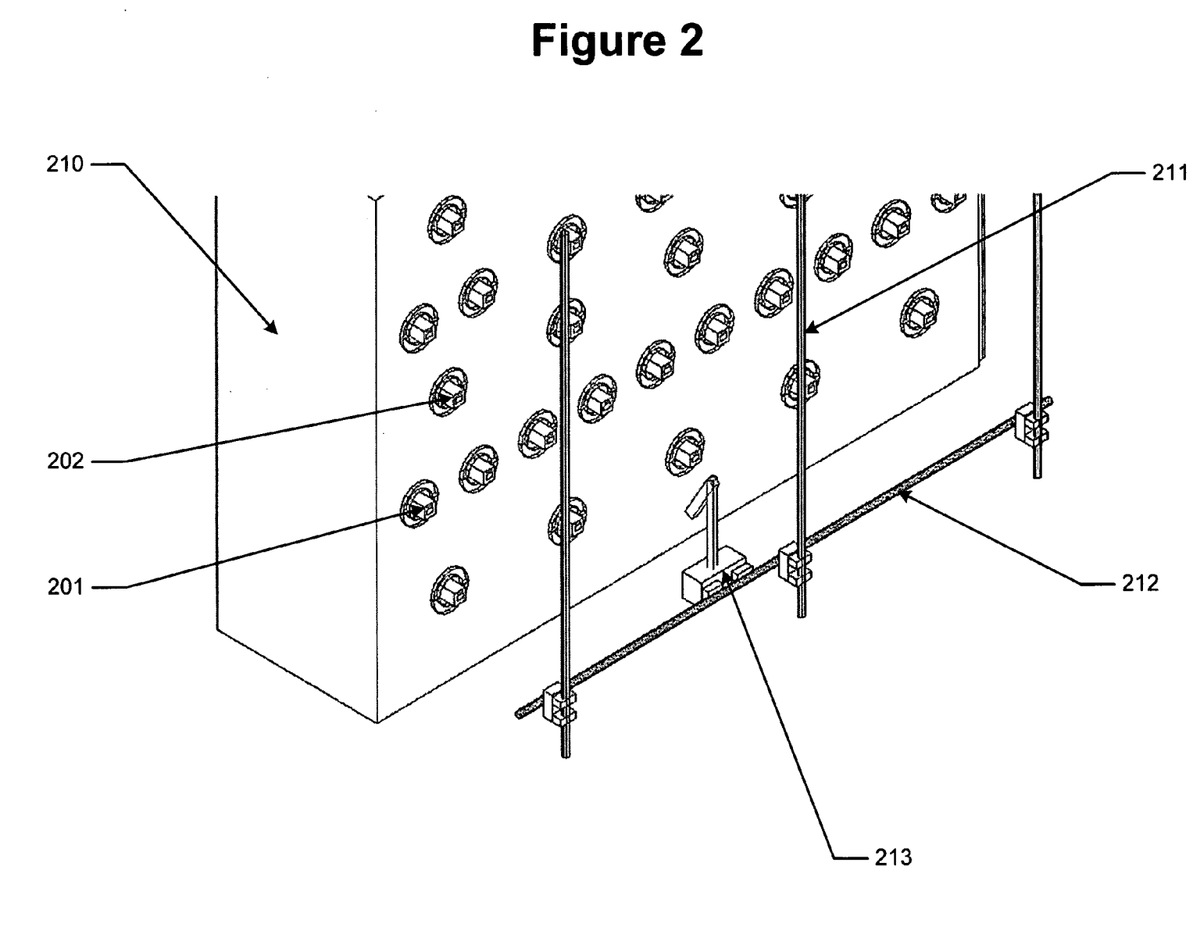
FIG. 2 illustrates a back view of a vertical fab embodiment where the fabricator cleanspace walls are see through for illustration of how handling automation can function.

Referring now to FIG. 2, a view of a fabricator 210 is shown illustrating a side for introducing a substrate to one or more ports on a processing tool 102, wherein the processing tools are arranged in a horizontal and vertical matrix. By making the clean space walls transparent, the operation of an embodiment of fabricator automation can be shown. Item 211 illustrates a vertical rails the robotics can ride upon. A corresponding horizontal rail is shown as 212 and the robotic handler as 213. These robotics can move the carrier from tool to tool through the tool ports, for example from tool port shown as item 201 to tool port shown as item 202.

In some embodiments, a base fabricator design, with tools 102 on the periphery and stacked in the vertical dimension can function as a fabrication environment. Also, in some embodiments, a rapid thermal anneal tool can be capable of interfacing with an 8" SMIF port to receive pods of 25 wafers at a time, wherein the SMIF automation is hard mounted to a fabricator support and gas line connections are welded in place.

A processing tool of one of various types can also be altered to allow the tool to be reversibly removable from a fabricator. This method specifically relates to altering the tool design to create a tool body that can interface with a locating chassis of some kind.

Figure 3:
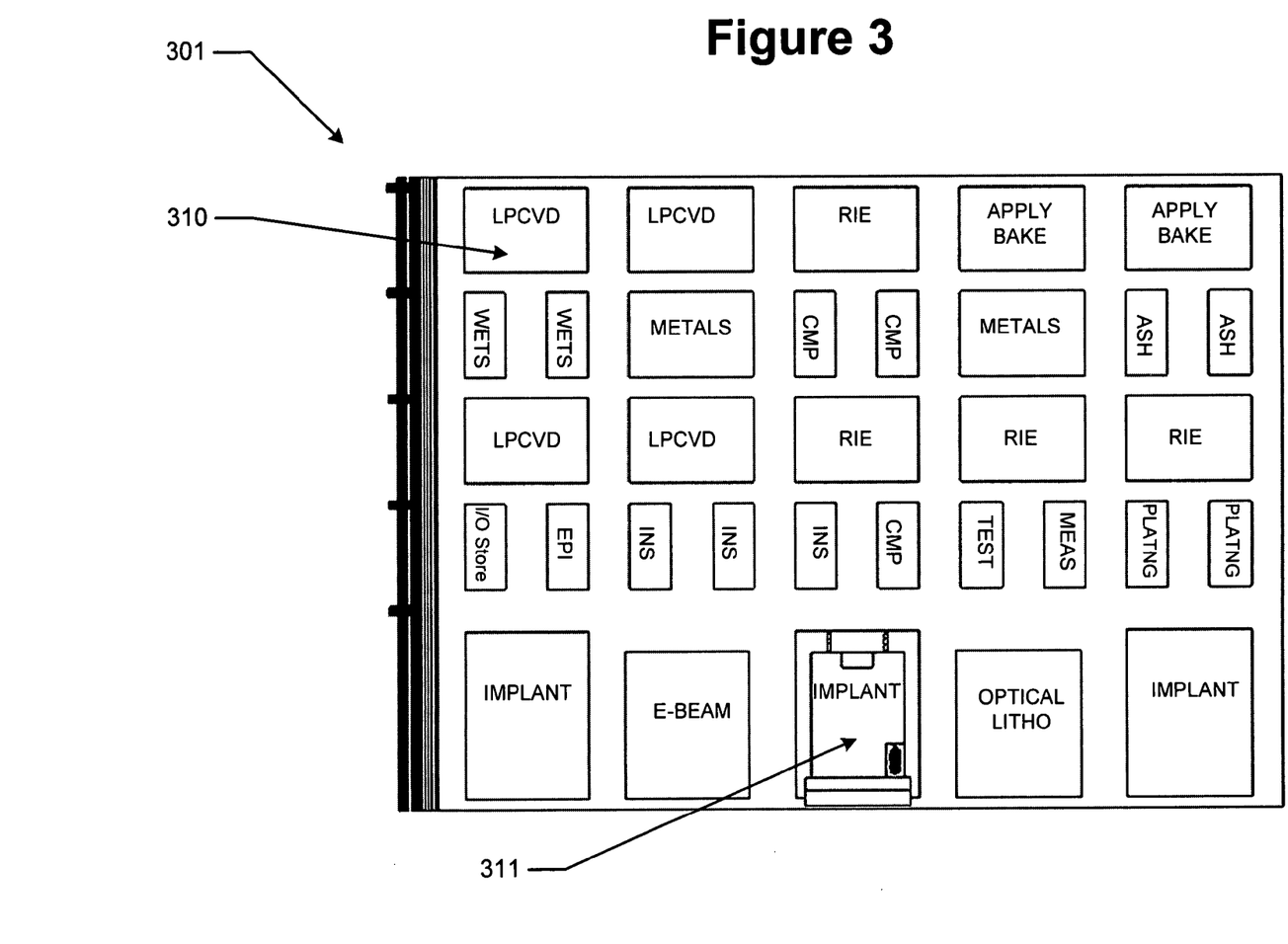
FIG. 3 illustrates a front view of a fab embodiment with many tool types indicated.

Referring now to FIG. 3 a schematic front view of a novel fabricator 301 is displayed. A fabricator 301 thus configured creates a novel processing environment in its own rights. However, to function the fabricator needs to be populated with processing tools that may perform standard processes used to make state of the art devices on the substrate surface. The process environment can include industry standard tools or tools that are specifically designed to be situated in a horizontal and vertical matrix, and, in some embodiments with multiple small clean spaces each clean space sufficient to encompass one tool port.

FIG. 3 depicts how standard processing tool types can be arrayed in a fabricator, 301, incorporating the novelty discussed herein. Each of the tools, such as, for example 310, can include on its face an indicator or other description of the tool type. Also for reference, tool 311, shows an example of a tool in the process of being replaced.

Each of the tool types in FIG. 3 can have been designed using the methods discussed previously. For example, LPCVD can refer to the common Low Pressure Chemical Vapor Deposition processing equipment. The typical state of the art materials and designs for a reactor of this type are still operant in this environment; however, it may be made consistent with single wafer processing. Processing the substrate on a susceptor with the reactants passing over the single wafer can be such a change. Furthermore, the tool can be redesigned to have its chemical gas lines routed through a single location where they can be easily connected and disconnected. The body of the tool, can be designed to sit on a base which itself can interface to the chassis that all tool bodies in a fab of this type can sit on. Input to the tooling can be made through the tool port which can involve redesigning the tool body's internal wafer handling systems to interface with this tool port and its location. These general methods are not used in a state of the art fabricator of a conventional design.

In much the same way all the tool types shown can be designed following this method.

Embodiments can therefore include, for example, Reactive Ion Etch equipment shown in FIG. 3 and others as ROE. Photo Resist application tools which may have baking capability are illustrated as APPLY BAKE tools. Chemical processor focused on single wafer front side and backside chemical processing for etches and cleans are shown as WETS. Metal deposition equipment capable of depositing Aluminum, Titanium, Copper, and Gold to name a few example metals are show as METALS tools. Chemical Mechanical Polishing equipment are shown as CMP equipment. Photoresist and chemical plasma treatment tooling is shown as ASH tooling. Equipment designed to store carriers in a controlled manner and allow input and removal of the carriers from the fabricator to the outside environment are shown for example as I/O Store. Epitaxial deposition tooling is shown as EPI. Plasma enhanced CVD, Plasma reactive CVD or Physical Deposition of insulator films is shown as INS. Electrical probing equipment is shown as TEST. Physical measurement tooling is shown as MEAS. Chemical Plating tooling, for example for Copper plating, is shown as PLATING. Ion Implantation tooling is shown as IMPLANT. Lithographic tooling is shown either as E-BEAM if the image writing is done with an electron beam or OPTICAL LITHO if a laser or other optical light source is used to expose a masked image. These are some examples of tools that can be innovated from current designs using a method based on this new fabricator environment.

It may be noted that while the discussion has focused on tooling that has an already established industry presence and solution this is not the only tool types that can use this method. In a more general sense, any processing tool even those to be developed can be designed to be consistent with this fabricator design using the method discussed. While this method does not fully result in a tool solution, it does allow the methods that do result in tooling solutions to be enhanced to allow that solution to work in this novel environment.

Figure 4:
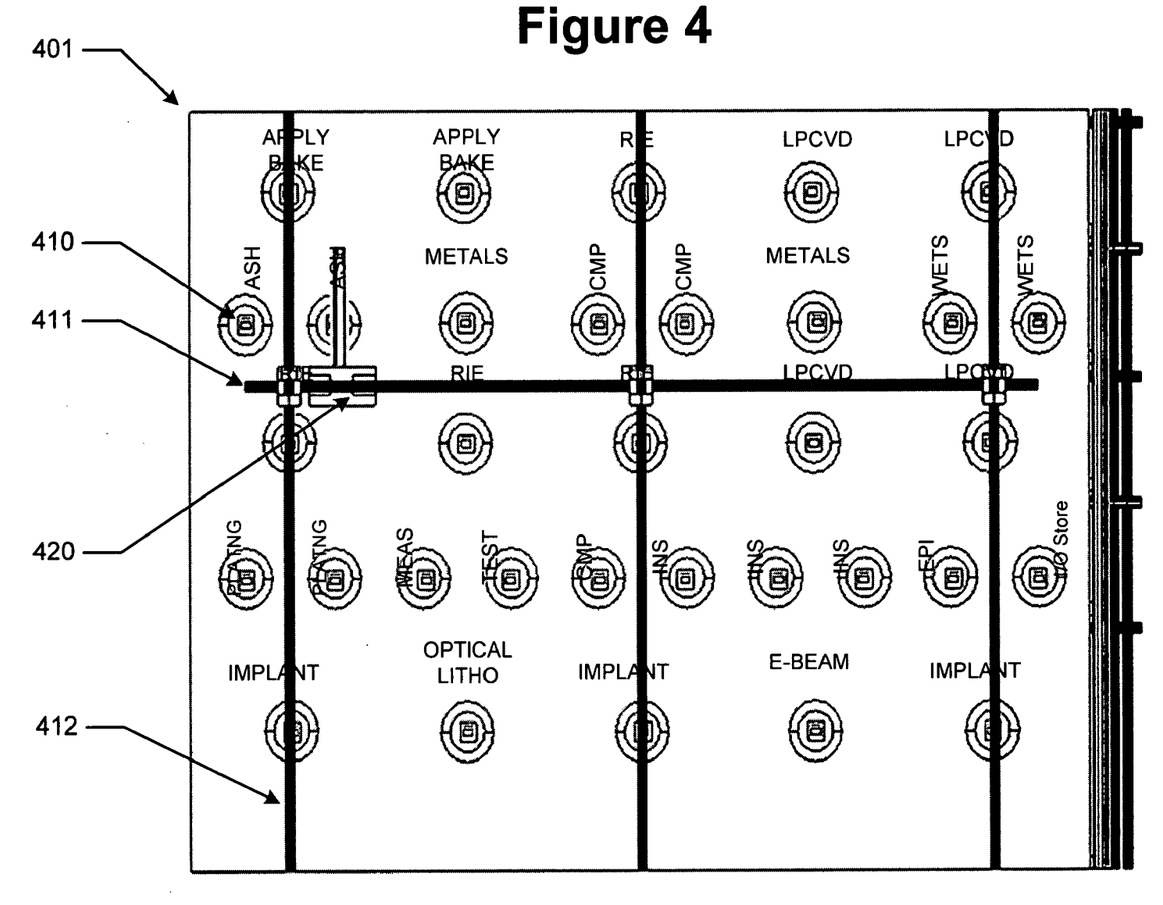
FIG. 4 illustrates a back view of the fab embodiment of FIG. 3 showing the automation robotics.

In the backside view of FIG. 4, aspects are illustrated indicating how the locations of the various tools in the fabricator environment 401 together with the ports 410, that are on each tool body. A substrate carrier can be handed off from a logistics robot, 420, to such a tool port, 410. The process can work by a tool of any type having already handed off a carrier to the robot 420. Robots 420 can move in one or more of a vertical direction along the rails of type 412 and along the horizontal dimension along rail 411 until it is situated at the appropriate location in front of a processing tool's port. In FIG. 4 the robot is shown to have moved in front of an ASH tool. The robot 420 can then place the carrier into the ash tool's port so that it can receive a process appropriate to that tool type.

Figure 5:
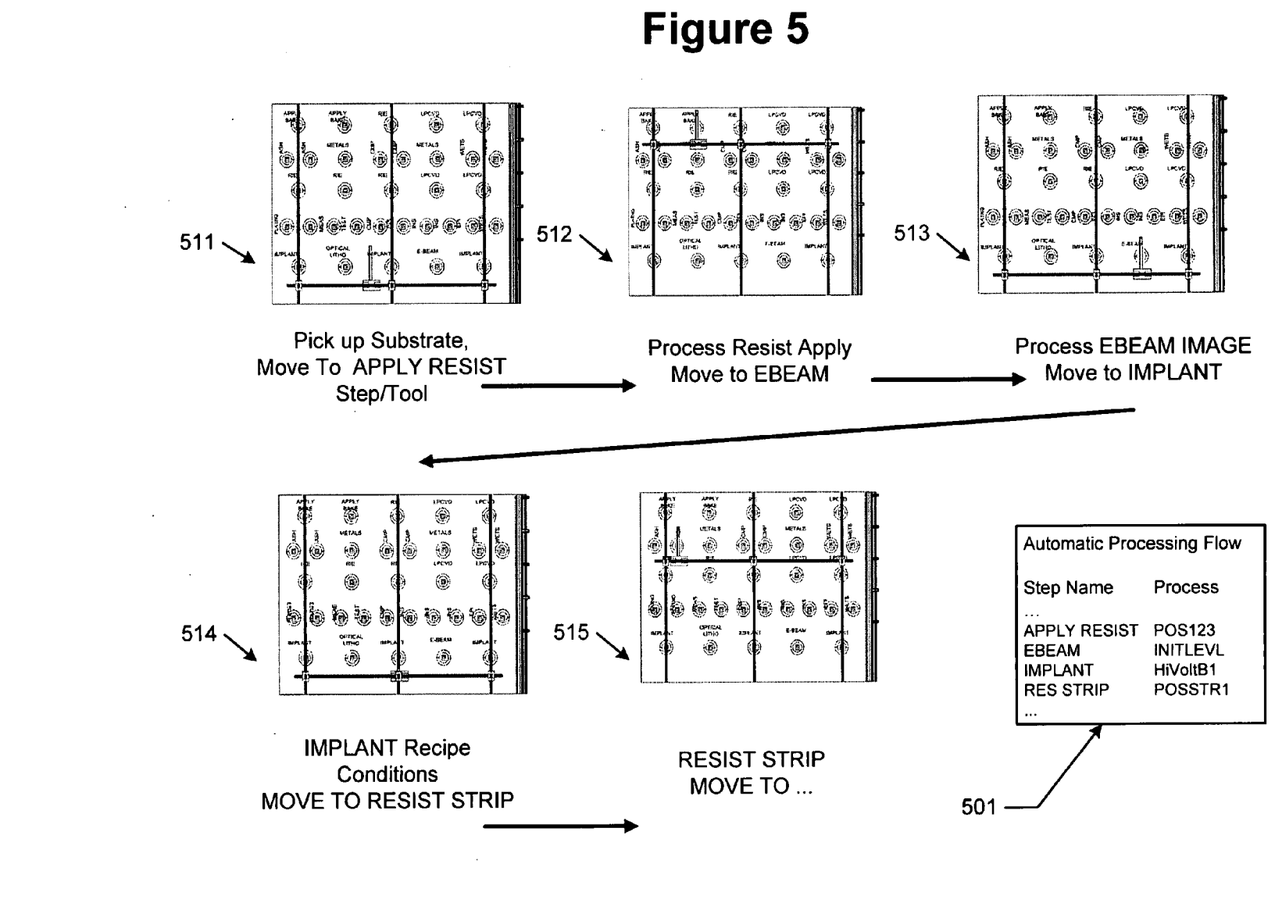
FIG. 5 illustrates an example movement of a substrate by automation to processing tools indicated in a shown process flow.

FIG. 5 takes the step forward by illustrating how a series of steps can be performed by movements discussed above relating to FIG. 4. In item 501 a flow diagram in a written form, which can be electronically stored in a computing mechanism, can schematically represent the movement, and handoffs of the logistic robots to the tool ports of the various tooling. In such a manner, processing of substrates can be represented in software code. It is also important to note that by having such a process flow in an electronic computer, that the automation systems of the fabricator can be automatically directed on how to process a substrate. IN some embodiments, multiple substrates can be coincidentally processed in the fab environment with the computing mechanism directing the movement of each substrate from one tool port to another and also providing instructions to each processing tool 102 via data communication. The instruction can include, for example, a command to receive a substrate and to perform certain processes on the received substrate.

By directing a substrate to move in and out of numerous tools to receive numerous process steps in a much longer version of the processing example depicted in FIG. 5 devices of various types can be manufactured on the substrates. While the resulting devices may not differ in this method of manufacturing from a more typical one, it may be apparent that this method of manufacturing the device in how the process tools are arrayed in a clean space, in how the substrates are moved to those tools is novel in its own right.

This description has described the general case of how to make a device of a particular process type. It may be clear that the generality is anticipated to allow for novel ways of making devices of any type. Specific known types are specifically claimed for the novel aspects of this method in affecting a processing of substrates to manufacture the specific device type. Devices can be made for Complementary Metal Oxide Semiconductor devices CMOS, for MOS, for Bipolar, for BiCMOS, for Memory, for III/V, for Power, for Communication, for Analog, for Discrete, for Microcontrollers, for Microprocessors, for Microelectronic Machines (MEMS) and sensors, for Optical, for Bioelectronic devices. These specific device types should not limit the generality of any device type that can be built on a substrate being manufactured with the general method described herein.

Figure 6:
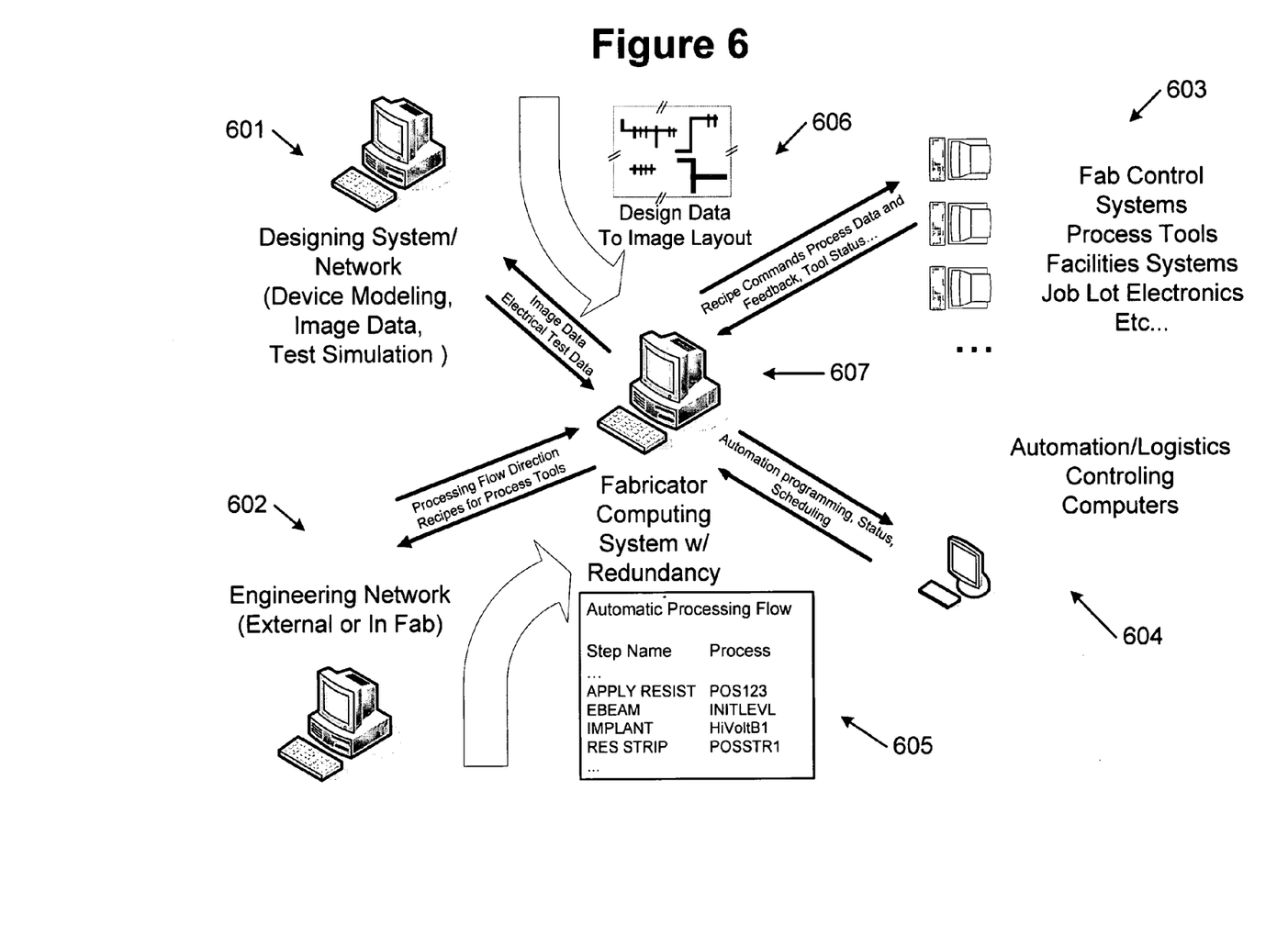
FIG. 6 illustrates an embodiment of the interaction of automation and electronics systems operant in a fab embodiment of the type in FIG. 1.

Referring now to FIG. 6 an illustration of how such automation can be set up in a fabricator type according to the present invention is illustrated. At 607, a fabricator computing system can have control over data communication extending within and outside of a fabricator. In some embodiments, the fabricator computing system 607 can interact with an external engineering system for the purpose of exchanging technical data, process data, flow data, imaging data for example to be passed on to Electron Beam equipment, for electrical test data and the like. The fabricator computing system 607 can also retain the substrate history logs for what processing has occurred in them and also what processing is specified to occur in the future. It can control the automation systems to move substrates via robotic automation associated with the fabricator and also to direct the processing tools on how to process and handle substrates that are given to it. Although a computer is shown for illustration, the sophistication of this main processing systems can be quite high with redundant processing units, significant data storage capabilities and significant communication capabilities over networks, radio frequency control and the like. Some embodiments therefore include a storage device which accesses a storage medium. The storage medium can include executable code and data for executable by a processor to control various aspects of the fabricator tools and the robotic automation.

According to the present invention, a fabricator computing system may interact with one or more of: a design system 601 for device modeling, imaging and test simulation; engineering systems 602 functional to create and administer processing flow directions and recipes for process tools; fab control systems 603 functional to control process tools, facilities systems and job lot electronics; automation and logistics controlling computers 604 for programming robotics automation, status of substrate movement and scheduling; and systems for creating and administering design data and image layout 606.

Control systems and handling mechanisms are therefore able to cause the fabricator to act on single substrates at a time. Embodiments can therefore include each substrate being processed in unique ways or predefined processes being repeated on individual substrates. Embodiments of the present invention can therefore be particularly well suited for the purposes of prototype or low volume manufacturing.

Figure 7:
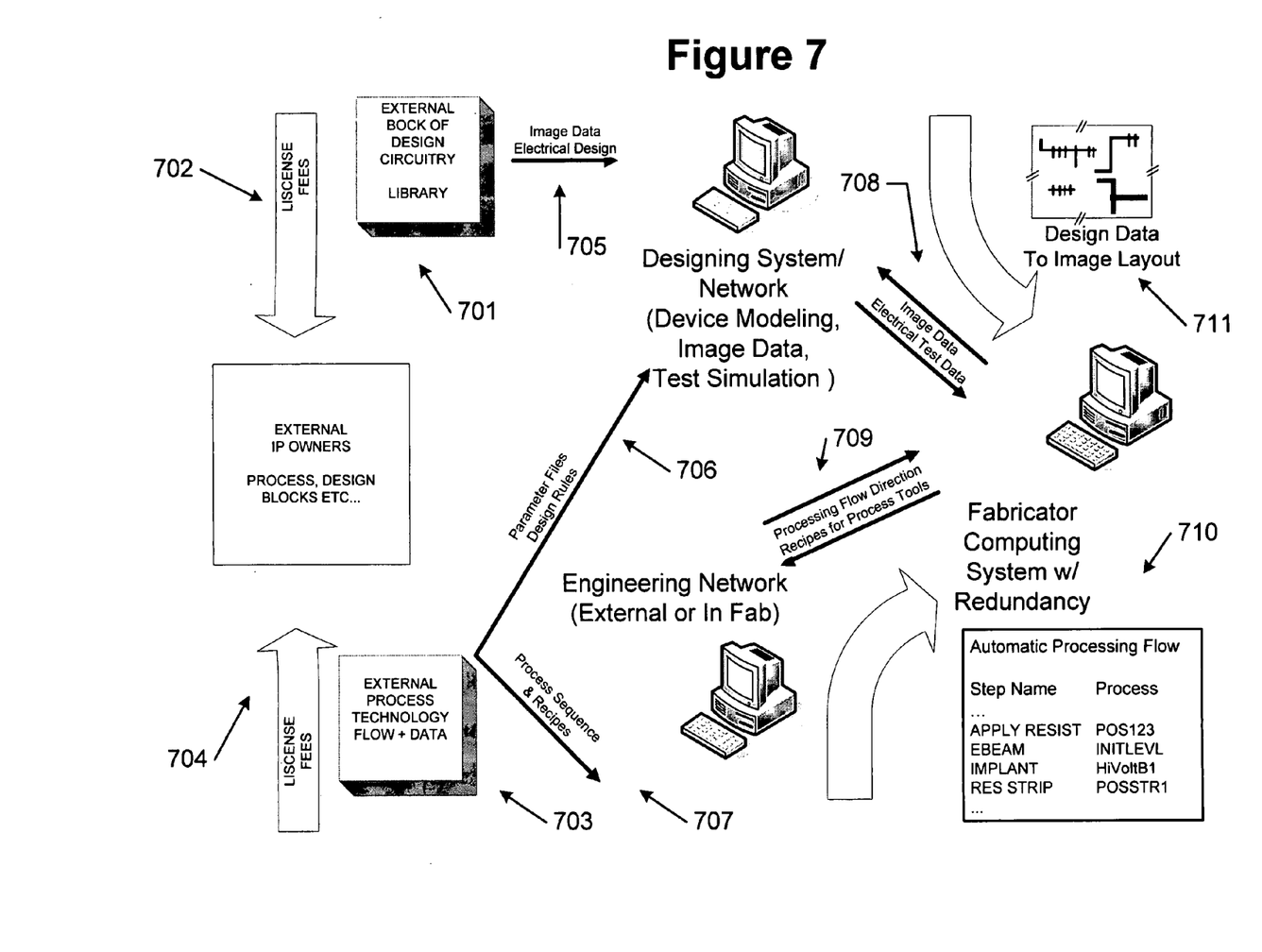
FIG. 7 illustrates a demonstration of how an intellectual property fab automation system can interact with a fabricator automation system.

Referring now to FIG. 7, in some embodiments, design and control environments shown in FIG. 6 can also be enhanced such that design of a particular device can be represented by a number of functional blocks 701. With the unique ability to create a single small substrate, particularly when a lithograph utilized is a direct write operation, as for example, electron beam lithography, it can be plausible that a designer of a circuit can integrate predefined function blocks of various kinds into a design from an external source.

A fabricator environment can control processing of a submitted design while the designer can indicate both the process flow and the design data to process the substrate. In some embodiment a library 701 of design blocks and process flows can be made available to a designer. The designer may indicate a series of predefined design blocks 703 to be utilized to create a new design in the aggregate and in the order specified by the designer. In some embodiments, a designer may request to use design blocks and processing flows that are the intellectual property of other entities, a licensing system 702 can track such usage and automatically apply license terms, license fees 704 and royalty type aspects for the use of either the design block or the process flow or both.

Parameter files and design rules 706 may be communicated with a design system network 706 and process sequences and recipes can be communicated with an engineering network 707. In some embodiments, one or more of the systems can be located external to the fabricator.

Embodiments can also include communication of image data 708 and processing flow directions and recipes for process tools 709 to and from a fabricator computing system 710. The fabricator computing system 710 can generate and store design data 711 for image layouts and automated processing flows. An automated process flow, can include, for example, a series of step names and processes.

Figure 8:
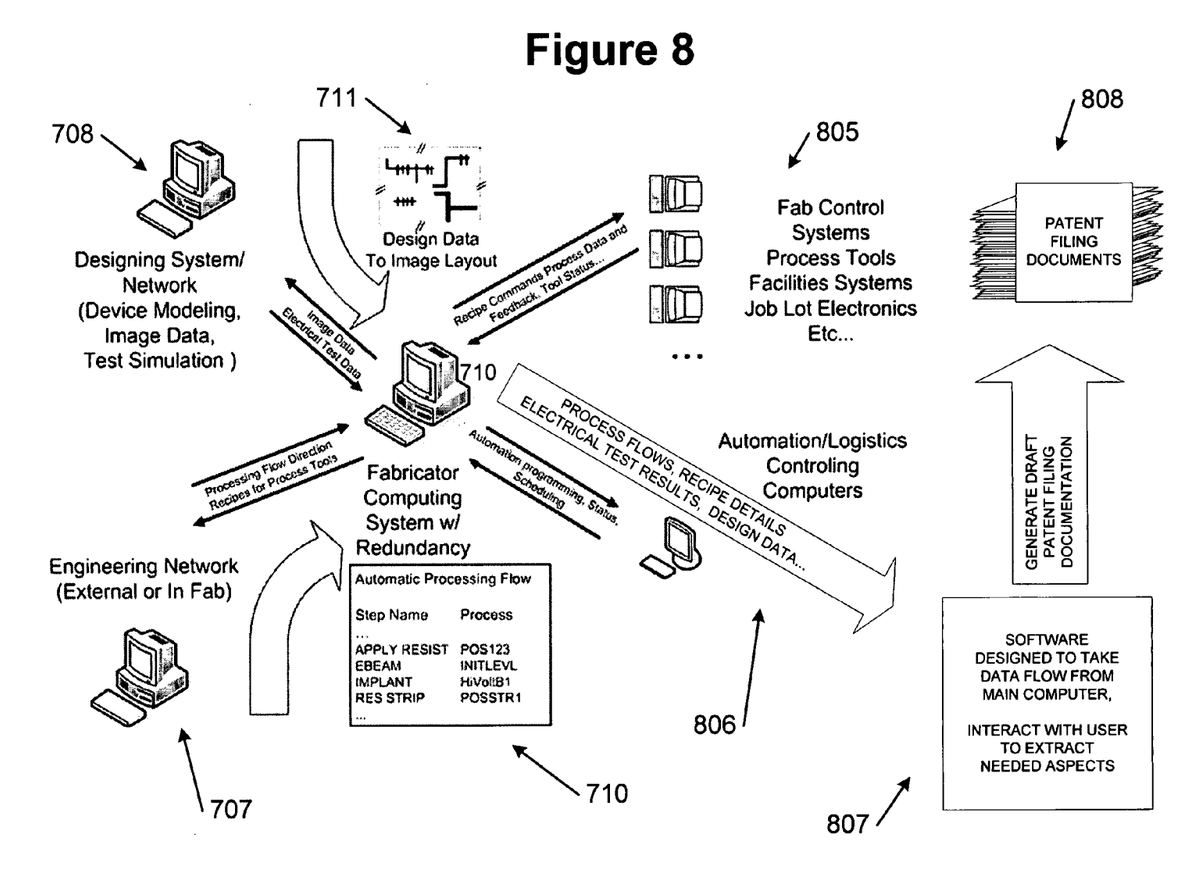
FIG. 8 illustrates a patent documentation system based on information contained in fabricator automation control systems.

Referring now to FIG. 8, an exemplary license system architecture 800 is illustrated according to the present invention, wherein data retention capabilities of a main processing unit 710 of a fabricator can be integrated into an intellectual property system 806 that automatically prepares intellectual property ownership documents. The licensing system can be operative via software to receive data flow from any of the fabricator components and extract data which can be compiled into intellectual property. The data can include, for example: process flows, process conditions, designs, duration of process steps, sequence of process steps and any other variables of process steps implemented by process tools and robotic automation included in a fabricator. Documents can include, for example, support for patent filing documents 808, copyrights or other similar concepts. According to the present invention, the license system architecture 800 can also be the manner that owners of particular intellectual property can license these particular properties to additional fabricator units of the type envisioned in this description. The licensing schemes can incorporate any of the variety of typical schemes including encryption or identification key tracking or the like; however, the use of such schemes for design flows and design data is new.

Design aspects which may be stored in an electronic storage and accessed by a design system may include, by way of non-limiting example: CMOS type device flow; elements of a bipolar type device flow; elements of a memory type device flow; elements of a III/V type device flow; Microprocessor designs; Power Circuit designs; Communication designs; Analog designs; Discrete designs; Erasable Memory designs; T Microcontroller designs; MEMS designs; Optical designs; Bioelectronic designs; Chemical Mechanical Polishing processes; perform Electron Beam Lithography processes; Optical Lithography processes; Immersion Optical Lithography processes; Rapid Thermal Annealing or Reaction processes; Thermal Chemical Vapor Deposition; Chemical Vapor Deposition; Physical; and Vapor Deposition processes.

Figure 9:
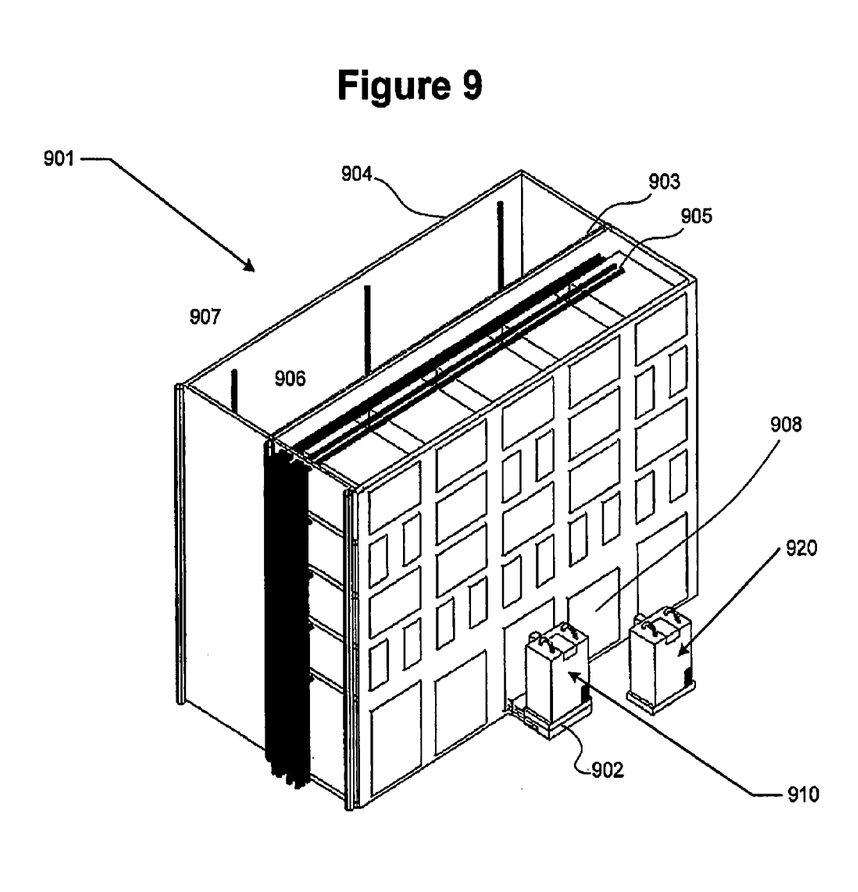
FIG. 9 illustrates a example of a reversibly removable tool body being replaced in an example fabricator embodiment.

Referring now to FIG. 9, as has been mentioned, processing tools 910 in the fabricator according to the present invention can be easily replaced by access from a side other than the side used to receive a substrate. As can be seen in this diagram, a tool residing in the fabricator 901, that in FIG. 3 was indicated as an implant tool for its position, can sit on a chassis 902 that can be extended from a position in a first boundary 903 when the tool needs to be removed. The first boundary 903 and a second boundary 904 partially define a cleanspace by defining a first region 906 and a second region 907. An identical tool of this type, 920 can be in the vicinity so that when the facilities lines 905 of the tool 910 are disconnected it, 920, can be moved onto the chassis, moved into the correct position in the fab and then have the facilities lines connected.

In other embodiments, a process tool 910 can be include a disparate cleanspace pod which encloses all or part of the process tool 910. For example cleanspace pod may only encompass a port portion of a processing tool and thereby be functional to receive a substrate into a cleanspace environment and process the substrate while it is maintained in a cleanspace environment. In other embodiments, a pod may fully contain a processing tool 910, such that during replacement of a processing tool in a horizontal and vertical matrix, a full cleanspace pod 908 which includes a processing tool within it, is removed and a replacement cleanspace pod 908 is inserted, wherein the replacement pod includes within it a replacement tool intact. In this fashion, processing tools may be removed for service or updates and shipped to a service destination while the processing tool remains contained within its own cleanspace pod. In addition, a support matrix for pods can be constructed in a warehouse type environment and cleanspace pods, each pod containing a process tool, may be arranged in the matrix to easily construct a cleanspace fabricator. In some embodiments, it is even feasible to arrange such a matrix in a mobile unit, such as, for example, in a tractor trailer type container, a ship, or temporary facility such as a military camp.

Figure 10:
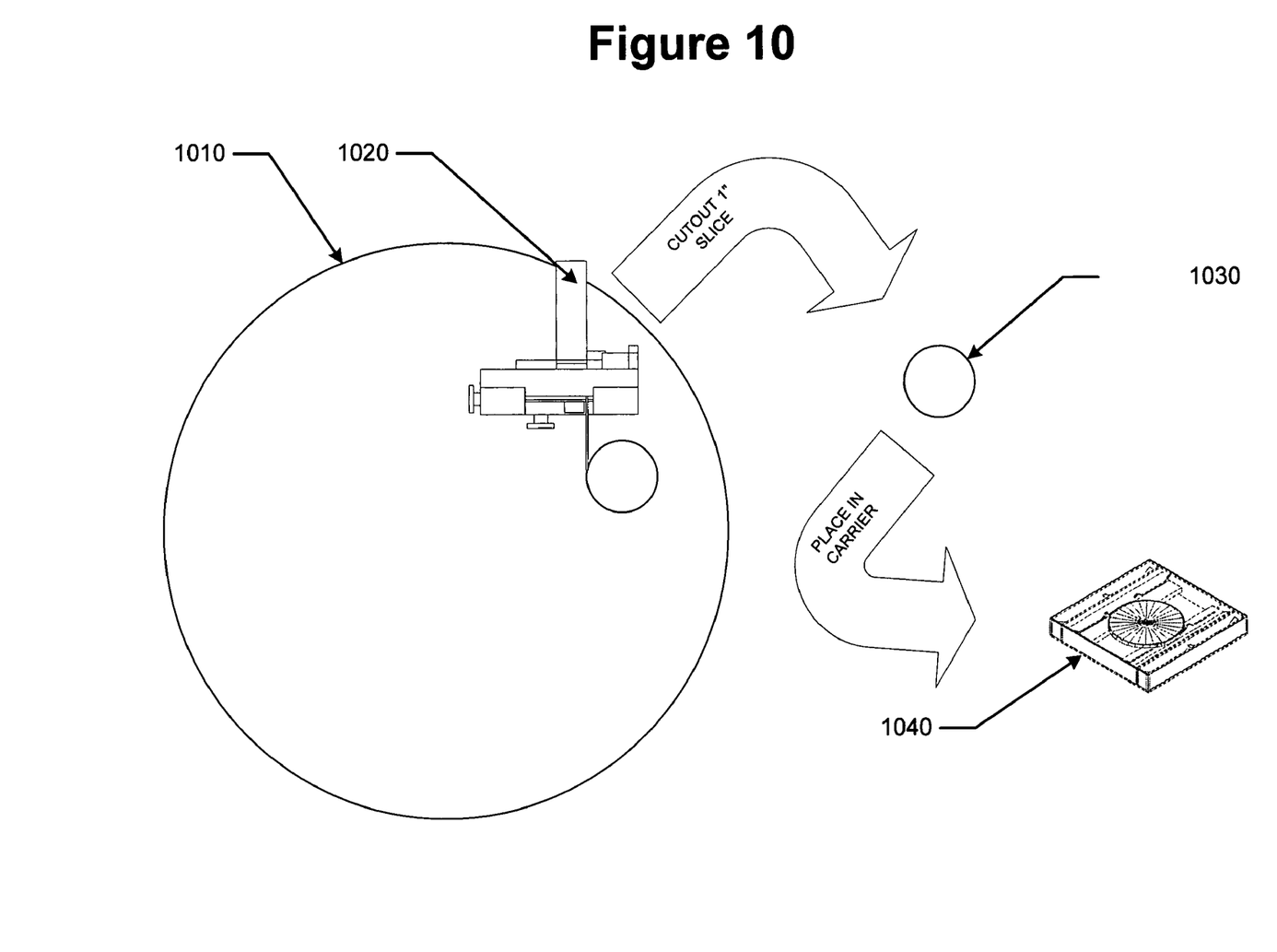
FIG. 10 illustrates an example of how a small substrate can be cut out of a larger substrate in order to be further processed in a fabricator of the types in this patent.

A different novel concept relating to the novel fab type can be the finishing of substrates that are generated as a cutout piece from an even larger substrate. Referring now to FIG. 10, for example, an eight inch substrate, 1010, can have a 1 inch substrate, 1030, cutout by a dicing tool 1020. Such tool can be a diamond saw type tool, a high pressure water jet tool, and a laser cutting tool or the like. Once the smaller substrate is prepared from the larger one, the smaller substrate 1030 can be placed in a wafer carrier 1040 and readied for further processing in the novel fabricator type. There can be numerous reasons that such an activity can be done for. For example, if a large volume fabricator wanted early yield information it can have a large wafer cut into a center piece and a few edge pieces and these can be prioritized through the novel fab in a similar process flow to provide testable devices in a very quick timeframe. Although an 8 inch wafer has been described in the given example, any size substrate can also be treated similarly.

Figure 11:
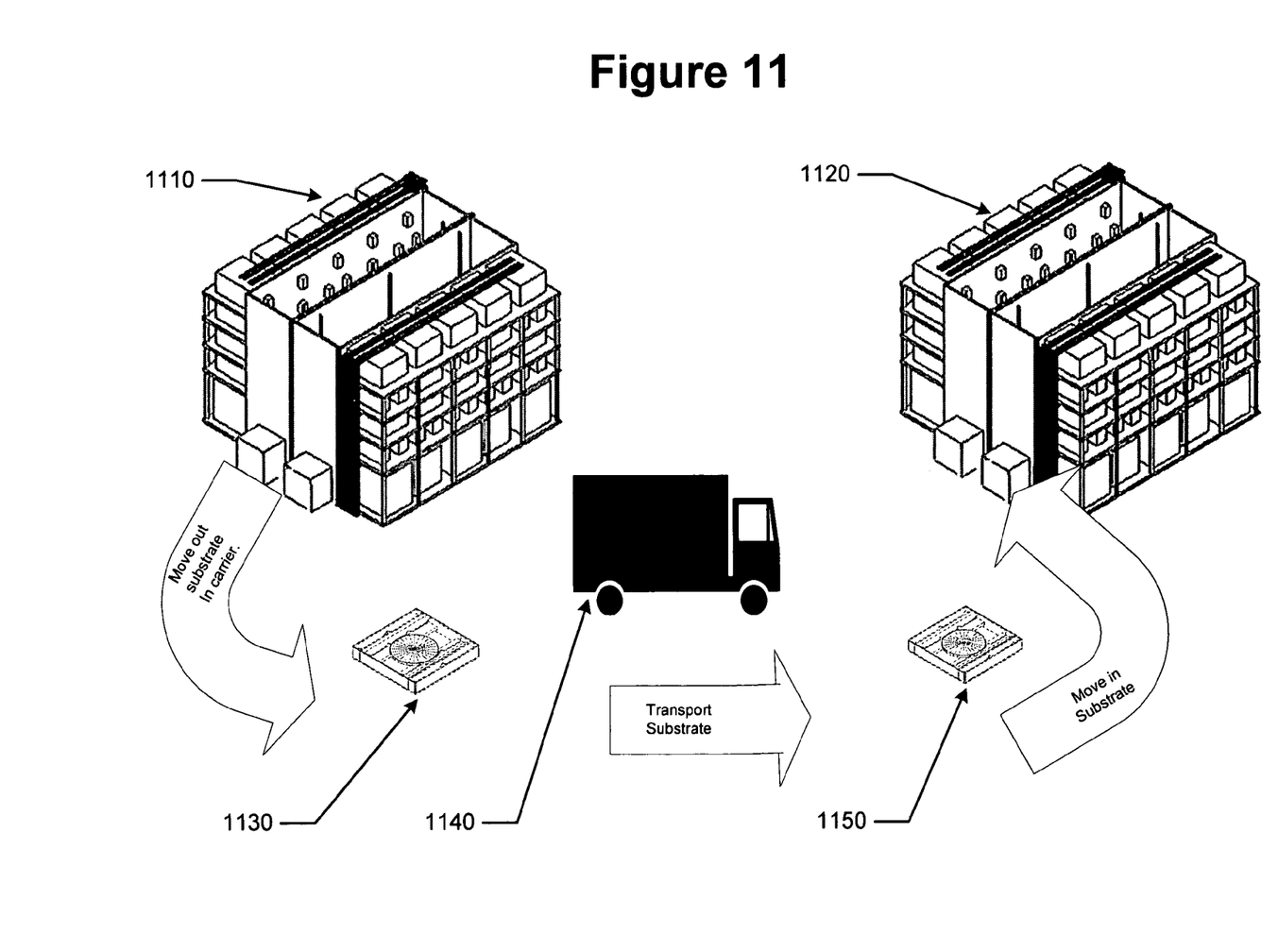
FIG. 11 illustrates an example of how a substrate in a substrate carrier can be processed in more than one fabricator of the type in this patent; being transported between said fabs in a carrier.

FIG. 11 shows another general concept. Since the substrates are stored in carriers that protect the substrate, such substrates can be processed different fabricators of the type described herein. The substrate can begin its processing in a fabricator of type 1110. After some level of processing it can be removed from said fabricator in a single substrate carrier, 1130, and then transported by some means 1140. When it arrived at another appropriate fabricator, the substrate can be replaced into the next fabricator of the type described herein, 1120, and processing can recommence. In this manner, in some embodiments, fabricators of different sizes and capabilities can be utilized to complete processing of a particular substrate.

Some embodiments of the present invention which relate to the specific application of semiconductor fabrication have been described in order to better demonstrate various useful aspects of the invention. However, such exemplary descriptions are not meant to limit the application of the inventive concepts described herein in any way. Embodiments may therefore include, for example, applications in research and generation of: pharmaceutical products, nanostructure products and other applications which benefit from the availability of cleanspace and multiple processing tools.

GLOSSARY OF SELECTED TERMS

Air receiving wall: a boundary wall of a cleanspace that receives air flow from the cleanspace.

Air source wall: a boundary wall of a cleanspace that is a source of clean air flow into the cleanspace.

Annular: The space defined by the bounding of an area between two closed shapes one of which is internal to the other.

Automation: The techniques and equipment used to achieve automatic operation, control or transportation.

Ballroom: A large open cleanroom space devoid in large part of support beams and walls wherein tools, equipment, operators and production materials reside.

Batches: A collection of multiple substrates to be handled or processed together as an entity Boundaries: A border or limit between two distinct spaces—in most cases herein as between two regions with different air particulate cleanliness levels.

Circular: A shape that is or nearly approximates a circle.

Clean: A state of being free from dirt, stain, or impurities—in most cases herein referring to the state of low airborne levels of particulate matter and gaseous forms of contamination.

Cleanspace: A volume of air, separated by boundaries from ambient air spaces, that is clean.

Cleanspace, Primary: A cleanspace whose function, perhaps among other functions, is the transport of jobs between tools.

Cleanspace, Secondary: A cleanspace in which jobs are not transported but which exists for other functions, for example as where tool bodies may be located.

Cleanroom: A cleanspace where the boundaries are formed into the typical aspects of a room, with walls, a ceiling and a floor.

Core: A segmented region of a standard cleanroom that is maintained at a different clean level. A typical use of a core is for locating the processing tools.

Ducting: Enclosed passages or channels for conveying a substance, especially a liquid or gas—typically herein for the conveyance of air.

Envelope: An enclosing structure typically forming an outer boundary of a cleanspace.

Fab (or fabricator): An entity made up of tools, facilities and a cleanspace that is used to process substrates.

Fit up: The process of installing into a new clean room the processing tools and automation it is designed to contain.

Flange: A protruding rim, edge, rib, or collar, used to strengthen an object, hold it in place, or attach it to another object. Typically herein, also to seal the region around the attachment.

Folding: A process of adding or changing curvature.

HEPA: An acronym standing for high-efficiency particulate air. Used to define the type of filtration systems used to clean air.

Horizontal: A direction that is, or is close to being, perpendicular to the direction of gravitational force.

Job: A collection of substrates or a single substrate that is identified as a processing unit in a fab. This unit being relevant to transportation from one processing tool to another.

Logistics: A name for the general steps involved in transporting a job from one processing step to the next. Logistics can also encompass defining the correct tooling to perform a processing step and the scheduling of a processing step.

Multifaced: A shape having multiple faces or edges.

Nonsegmented Space: A space enclosed within a continuous external boundary, where any point on the external boundary can be connected by a straight line to any other point on the external boundary and such connecting line would not need to cross the external boundary defining the space.

Perforated: Having holes or penetrations through a surface region. Herein, said penetrations allowing air to flow through the surface.

Peripheral: Of, or relating to, a periphery.

Periphery: With respect to a cleanspace, refers to a location that is on or near a boundary wall of such cleanspace. A tool located at the periphery of a primary cleanspace can have its body at any one of the following three positions relative to a boundary wall of the primary cleanspace: (i) all of the body can be located on the side of the boundary wall that is outside the primary cleanspace, (ii) the tool body can intersect the boundary wall or (iii) all of the tool body can be located on the side of the boundary wall that is inside the primary cleanspace. For all three of these positions, the tool's port is inside the primary cleanspace. For positions (i) or (iii), the tool body is adjacent to, or near, the boundary wall, with nearness being a term relative to the overall dimensions of the primary cleanspace.

Planar: Having a shape approximating the characteristics of a plane.

Plane: A surface containing all the straight lines that connect any two points on it.

Pod: A container separating an interior space comprising one or more tooling components from an exterior space.

Polygonal: Having the shape of a closed figure bounded by three or more line segments Process: A series of operations performed in the making or treatment of a product—herein primarily on the performing of said operations on substrates.

Robot: A machine or device, that operates automatically or by remote control, whose function is typically to perform the operations that move a job between tools, or that handle substrates within a tool.

Round: Any closed shape of continuous curvature.

Substrates: A body or base layer, forming a product, that supports itself and the result of processes performed on it.

Tool: A manufacturing entity designed to perform a processing step or multiple different processing steps. A tool can have the capability of interfacing with automation for handling jobs of substrates. A tool can also have single or multiple integrated chambers or processing regions. A tool can interface to facilities support as necessary and can incorporate the necessary systems for controlling its processes.

Tool Body: That portion of a tool other than the portion forming its port.

Tool Port: That portion of a tool forming a point of exit or entry for jobs to be processed by the tool. Thus the port provides an interface to any job-handling automation of the tool.

Tubular: Having a shape that can be described as any closed figure projected along its perpendicular and hollowed out to some extent.

Unidirectional: Describing a flow which has a tendency to proceed generally along a particular direction albeit not exclusively in a straight path. In clean air flow, the unidirectional characteristic is important to ensuring particulate matter is moved out of the cleanspace.

Unobstructed removability: refers to geometric properties, of fabs constructed in accordance with the present invention, that provide for a relatively unobstructed path by which a tool can be removed or installed.

Utilities: A broad term covering the entities created or used to support fabrication environments or their tooling, but not the processing tooling or processing space itself. This includes electricity, gasses, air flows, chemicals (and other bulk materials) and environmental controls (e.g., temperature).

Vertical: A direction that is, or is close to being, parallel to the direction of gravitational force.

While the invention has been described in conjunction with specific embodiments, it is evident that many alternatives, modifications and variations will be apparent to those skilled in the art in light of the foregoing description.

Accordingly, this description is intended to embrace all such alternatives, modifications and variations as fall within its spirit and scope.

What is claimed is:

1. A computerized system for controlling a substrate fabricator, the system comprising:
    a processor; a storage medium storing executable software operative with the processor for controlling processing tools in the substrate fabricator and executable on command to cause the system to:
    display a diagram of processing tools available in the substrate fabricator, wherein the diagram comprises a schematic representation of a handoff of a substrate by logistic robots to tool ports of at least two processing tools oriented in a vertical dimension in relation to each other and the two or more processing tools are located in a fabricator cleanspace comprising an outer boundary and an inner boundary and each of the processing tools is capable of independent operation and removable in a discrete fashion relative to other processing tools;
    indicate specific processes that each processing tool can perform;
    receive an indication of one or more specific processes to be performed on a single substrate; and
    transmit commands to cause robotic automation to transport the substrate to one or more appropriate processing tools and perform the specific processes on the single substrate, wherein each tool is sealed to a respective opening in at least one of the outer boundary and the inner boundary and the transmitted commands comprise:
    removing the substrate from a cleanspace comprising a substrate carrier into a cleanspace comprising a first tool port, performing a first process on the substrate in the first tool port;
    containing the substrate in the substrate carrier subsequent to the performance of the first process; transporting the substrate carrier to a second tool port;
    removing the substrate from the cleanspace comprising the substrate carrier into a cleanspace comprising the second tool port; and
performing a second process on the substrate in the second tool port.

2. The computerized system of claim 1 wherein the system additionally: correlates the one or more specific processes with intellectual property licensing terms; and generates an indication of the licensing terms to a user.

3. The computerized system of claim 2 wherein the system records licensing fees due as result of performing the one or more specific processes, or incorporating the one or more specific circuit element designs.

* * * * *